United States Patent
Zanderigo et al.

(10) Patent No.: US 8,546,778 B2
(45) Date of Patent: Oct. 1, 2013

(54) RESISTANCE VARIABLE MEMORY CELLS AND METHODS

(75) Inventors: Federica Zanderigo, Milan (IT); Andrea P. Marchelli, Nizza Monferrato (IT); Fabio Pellizzer, Cornate D'Adda (IT)

(73) Assignee: Micron Technology, Inc., Boise, ID (US)

( * ) Notice: Subject to any disclaimer, the term of this patent is extended or adjusted under 35 U.S.C. 154(b) by 166 days.

(21) Appl. No.: 13/117,372

(22) Filed: May 27, 2011

(65) Prior Publication Data

US 2012/0280195 A1    Nov. 8, 2012

Related U.S. Application Data

(63) Continuation-in-part of application No. 13/100,834, filed on May 4, 2011, now abandoned.

(51) Int. Cl.
*H01L 45/00* (2006.01)
(52) U.S. Cl.
USPC ...................................... 257/1; 257/E45.002
(58) Field of Classification Search
USPC .............................................. 257/1, E45.002
See application file for complete search history.

(56) References Cited

U.S. PATENT DOCUMENTS

| | | | |
|---|---|---|---|
| 5,322,809 A | 6/1994 | Moslehi | |
| 5,614,758 A | 3/1997 | Hébert | |
| 5,780,362 A | 7/1998 | Wang et al. | |
| 5,972,762 A | 10/1999 | Wu | |
| 6,207,563 B1 | 3/2001 | Wieczorek et al. | |
| 7,811,879 B2 | 10/2010 | Lam et al. | |
| 7,834,341 B2 | 11/2010 | Wu et al. | |
| 2010/0065804 A1 | 3/2010 | Park | |

OTHER PUBLICATIONS

Baklanov, M.R., et al. "Surface processes occurring on TiSi2 and CoSi2 in fluorine-based plasmas: Afterglow of a NF3 plasma." Journal of Vacuum Science and Technology B, Jan./Feb. 1998, pp. 164-172, vol. 16 No. 1, American Vacuum Society (9 pgs.).

*Primary Examiner* — Long Pham

(74) *Attorney, Agent, or Firm* — Brooks, Cameron & Huebsch, PLLC

(57) ABSTRACT

Resistance variable memory cells and methods are described herein. One or more methods of forming a resistance variable memory cell include forming a silicide material on a terminal of a select device associated with the resistance variable memory cell, forming a modified region of the silicide material by modifying a resistivity of a region of the silicide material, forming a conductive element on at least a portion of the modified region, and forming a resistance variable material on the conductive element.

13 Claims, 9 Drawing Sheets

RESISTANCE VARIABLE MEMORY CELLS AND METHODS

PRIORITY APPLICATION INFORMATION

This application is continuation in part of U.S. application Ser. No. 13/100,834, filed May 4, 2011, the specifications of which are incorporated herein by reference.

TECHNICAL FIELD

The present disclosure relates generally to semiconductor memory devices and methods, and more particularly, to resistive variable memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, resistance variable memory, such as phase change random access memory (PCRAM) and resistive random access memory (RRAM), and magnetic random access memory (MRAM), such as spin torque transfer random access memory (STT RAM), among others.

Resistance variable memory devices, such as PCRAM devices, can include a structural phase change material such as a chalcogenide alloy, for instance, which can be programmed into different resistance states to store data. The phase change memory cells are nonvolatile and the particular data stored in a phase change memory cell can be read by sensing the cell's resistance (e.g., by sensing current and/or voltage variations based on the resistance of the phase change material).

In cases in which the resistance variable memory device includes a chalcogenide alloy, the chalcogenide alloy can exhibit a reversible structural phase change (e.g., from amorphous to crystalline). A small volume of the chalcogenide alloy can be integrated into a circuit that can allow the cell to act as a fast switching programmable resistor. This programmable resistor can, for example, exhibit greater than 40 times the dynamic range of resistivity between the crystalline state (low resistivity) and the amorphous state (high resistivity), and is also capable of exhibiting multiple intermediate states that allow multi-bit storage in each cell. That is, resistance variable memories may achieve multi-level cell (MLC) functionality via programming of memory cells to one of a number of different resistance levels.

Phase change memory cells often include a select device (e.g., a switching element such as a transistor or diode) used to drive a heater element in order to alter the resistance of the phase change material of the cell (e.g., via Joule heating). As such, the current driving capability of select devices associated with phase change memory cells can impact program and/or read operations.

DETAILED DESCRIPTION

Figure 1:
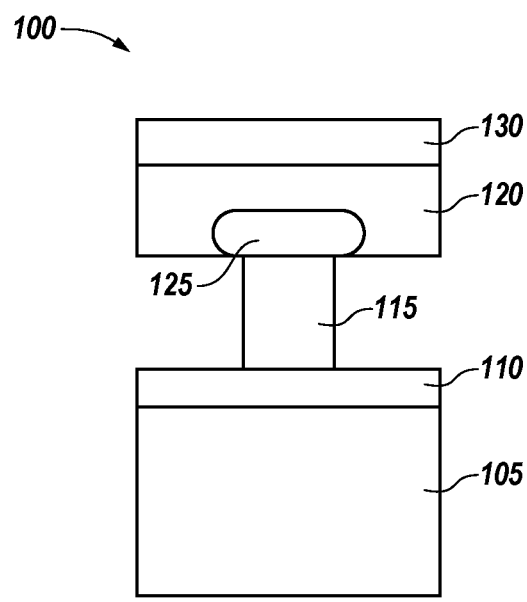
FIG. 1 illustrates a resistance variable memory cell in accordance with one or more embodiments of the present disclosure.

Resistance variable memory cells and methods are described herein. One or more methods of forming a resistance variable memory cell include forming a silicide material on a terminal of a select device associated with the resistance variable memory cell, forming a modified region of the silicide material by modifying a resistivity of a region of the silicide material, forming a conductive element on at least a portion of the modified region, and forming a resistance variable material on the conductive element.

Embodiments of the present disclosure can provide benefits such as increasing the current driving capability of select devices associated with resistance variable memory cells (e.g., phase change memory cells), among other benefits. For instance, one or more embodiments can provide improved (e.g., reduced) contact resistance associated with the interface between a heater element and a conductive contact (e.g., an electrode), as compared to previous approaches.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. Also, as used herein, "a number of" a particular element and/or feature can refer to one or more of such elements and/or features.

As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

As used in this disclosure, the term "substrate" can be understood to include silicon-on-insulator (SOI) or silicon-on-sapphire (SOS) technology, doped and undoped semiconductors, epitaxial layers of silicon supported by a base semiconductor foundation, and/or other semiconductor structures and technologies. Furthermore, when reference is made to a "substrate" in the following description, previous process steps may have been utilized to form regions or junctions in the base semiconductor structure or foundation.

FIG. 1 illustrates a resistance variable memory cell 100 in accordance with one or more embodiments of the present disclosure. In this example, the memory cell is a phase change memory cell 100. The memory cell 100 includes a select device 105, a first conductive contact 110, a conductive element 115 (e.g., a heater), a resistance variable material 120, and a second conductive contact 130.

The select device 105 can be a switching device such as a transistor (e.g., a bipolar junction transistor or field-effect transistor) or a diode (e.g., a p-n diode, a Zener diode, or a Schottky diode) that can be operated to drive current through a resistive heater element 115 (e.g., between the first and second conductive contacts 110 and 130) in order to alter the resistance of an active region 125 of the resistance variable material 120 (e.g., through Joule heating). The resistance variable material 120 can be a phase change chalcogenide alloy such as a Germanium-Antimony-Tellurium (GST) material (e.g., a Ge—Sb—Te material such as $Ge_2Sb_2Te_5$, $Ge_1Sb_2Te_4$, $Ge_1Sb_4Te_7$, etc.), among other resistance variable materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. The heater 115 can include materials such as titanium (Ti) titanium nitride (TiN), titanium silicon nitride (TiSiN), titanium aluminum nitride (TiAlN), and/or tantalum nitride (TaN), among other suitable heater materials.

The conductive contact 110 can be referred to as a bottom electrode and the conductive contact 130 can be referred to as a top electrode. The top electrode can serve as a data/sense line (e.g., a bit line) for the memory cell 100 or can be coupled to the bit line, and the select device 105 can be coupled to an access line (e.g., a word line) associated with the memory cell 100, for instance. In operation, appropriate voltage and/or current signals (e.g., pulses) can be applied to the bit lines and word lines in order to program data to and/or read data from the phase change memory cells of a memory cell array (e.g., an array of memory cells 100). As an example, the data stored by a phase change memory cell 100 can be determined by turning on select device 105 and sensing a current passing through the resistance variable material 120 (e.g., between the conductive contacts 110 and 130. The current sensed on the bit line associated with the memory cell being read corresponds to a resistance level of the material 120, which in turn corresponds to a particular data value (e.g., a binary value such as 1, 0, 001, 111, 1011, etc.).

The select device 105/electrode 110 interface and the heater 115/electrode 110 interface are in the current path of the select device 105. As such, the contact resistance between the bottom electrode 110 and the select device 105, as well as the contact resistance between the bottom electrode 110 and the heater 105, can impact the program, read, and/or erase operations associated with the memory cell 100. For instance, the contact resistances can affect the current driving capability of the select device 105, which can impact the time required for programming and/or reading as well as the power consumption associated with such operations.

In some previous approaches, a metal silicide material is formed on a select device to serve as an interface with underlying silicon. For instance, the metal silicide could be formed on an emitter of a vertical transistor in order to provide suitable contact resistance associated with the emitter-base junction and properties of the interface with silicon. As an example, a metal silicide can provide for little or no electromigration while providing a low resistivity as compared to poly-silicon contacts, for instance.

However, the metal silicide material 110 serving as an interface with the underlying silicon may not be suitable to serve as an interface with the heater element 115. As described further below, one or more resistance variable memory cells according to present disclosure include a silicide material formed on a select device and serving as an interface between a heater element of the memory cell and the select device. The silicide material can include an unmodified region having a surface that interfaces with the select device and a modified region having a surface that interfaces with the heater element. The modified region has a resistivity that is different than the resistivity of the unmodified region. Accordingly, embodiments of the present disclosure can improve the contact resistance associated with interfaces within a resistance variable memory cell, which can provide improved current driving capability of the cell select device as compared to previous approaches, among other benefits.

FIGS. 2A-2I illustrate an example of processing steps associated with forming a number of resistance variable memory cells in accordance with one or more embodiments of the present disclosure. FIGS. 2A through 2I illustrate a number of select devices formed on a base semiconductor substrate 202. As an example, the select devices can be bipolar junction transistors (BJTs). For instance, the select devices can be pnp BJTs in which the material 202 is a p-type semiconductor serving as a collector, the material 203 is an n-type semiconductor serving as a base, and the material 204 is a p+ semiconductor material serving as an emitter. However, embodiments of the present disclosure are not limited to a particular type of select device or select device configuration. The select devices illustrated in FIGS. 2A-2I can be formed via known semiconductor processing techniques, and the material 206 can be a dielectric material such as silicon dioxide ($SiO_2$), among other suitable dielectric materials.

Figure 2A:
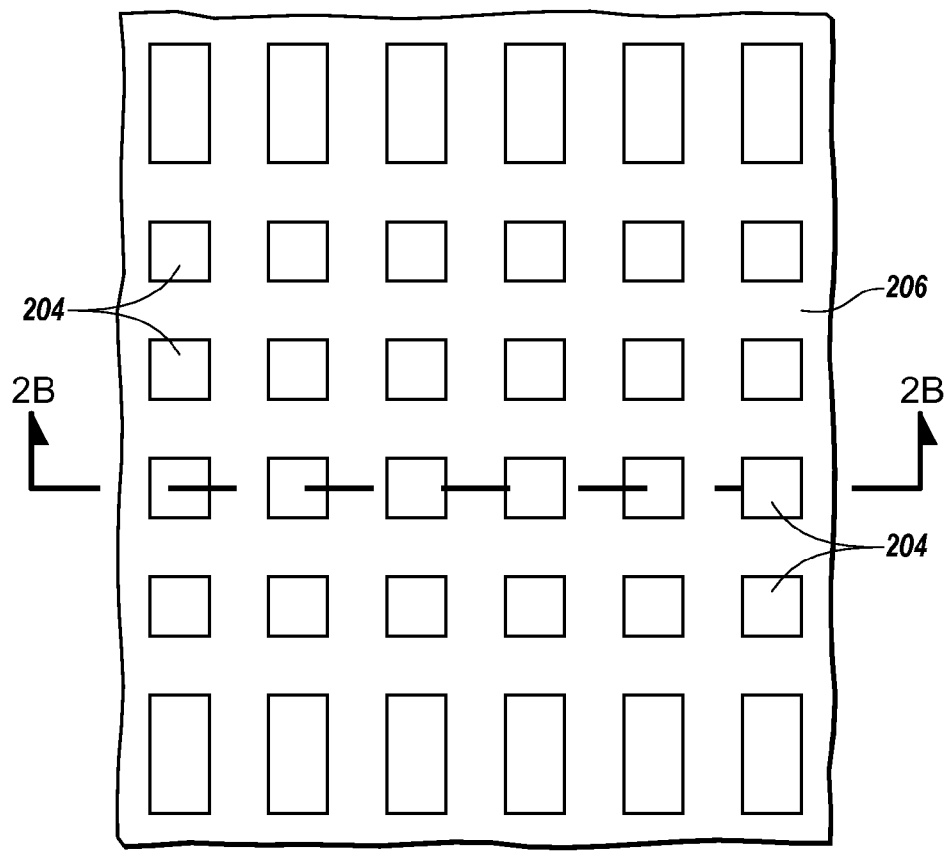
FIGS. 2A-2I illustrate an example of processing steps associated with forming a number of resistance variable memory cells in accordance with one or more embodiments of the present disclosure.
Figure 2B:
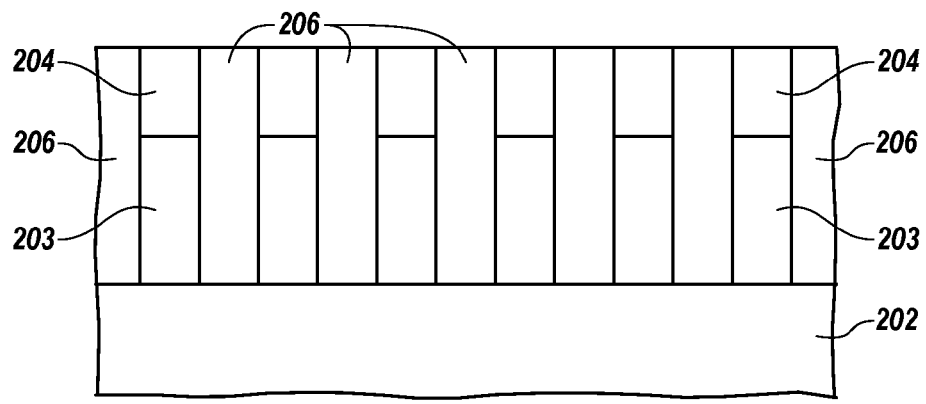
Figure 2C:
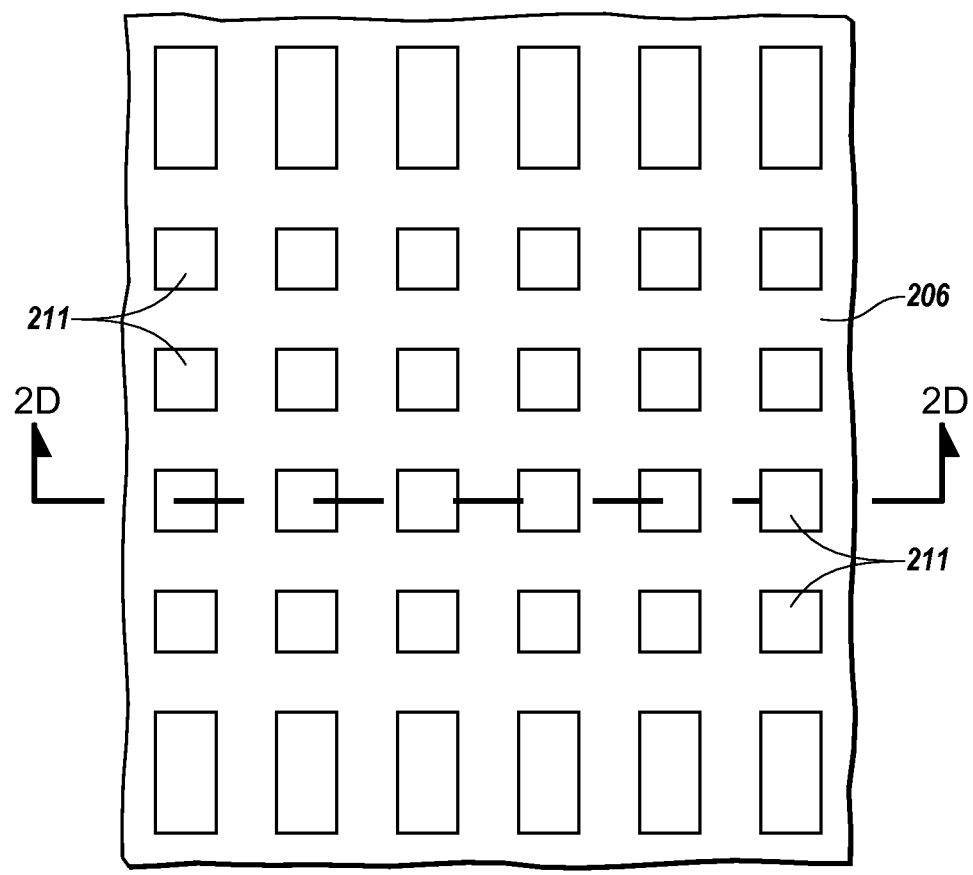
Figure 2D:
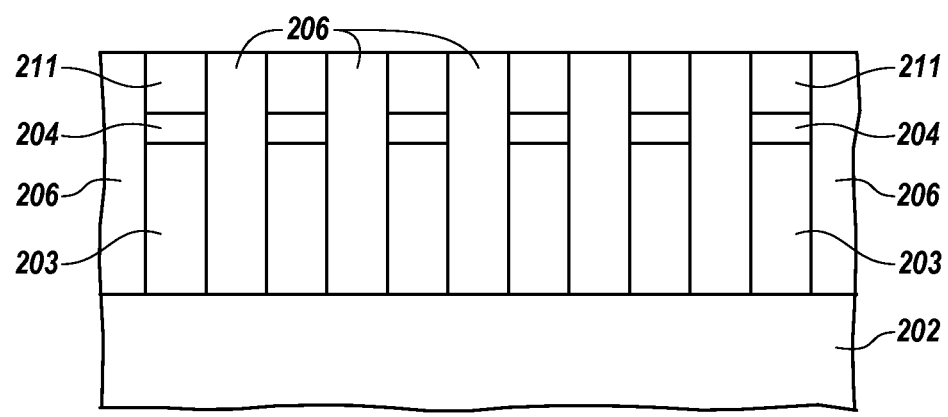

FIGS. 2C and 2D illustrate the number of resistance variable memory cells at a subsequent processing stage. In the example illustrated in FIGS. 2C and 2D, a salidization process has been performed to form a metal silicide material 211 on the material 204, which can serve as a terminal (e.g., an emitter) of the select device. The metal silicide 211 can be formed via a process such as direct deposit of pure metal onto the silicon material 204. However, embodiments are not so limited. For example, the metal silicide 211 can be formed by a simultaneous evaporation process, a sputter-deposition process (e.g., from a composite target or by co-sputtering), or a chemical vapor deposition (CVD) process, among other silicide formation processes. As described further below, the metal silicide 211 can serve as a conductive contact (e.g., conductive contact 110 shown in FIG. 1) between the material 204 and a heater element associated with the memory cell. As such, the metal silicide 211 can be a bottom electrode of the memory cell. In the example illustrated in FIG. 2D, the silicide 211 is self-aligned with the underlying silicon material 204 such that the silicide can be referred to as a salicide 211 (e.g., a self-aligned silicide). The silicide 211 can be a metal-silicon alloy such as cobalt silicide, titanium silicide, and nickel silicide, among various other metal silicides.

Figure 2E:
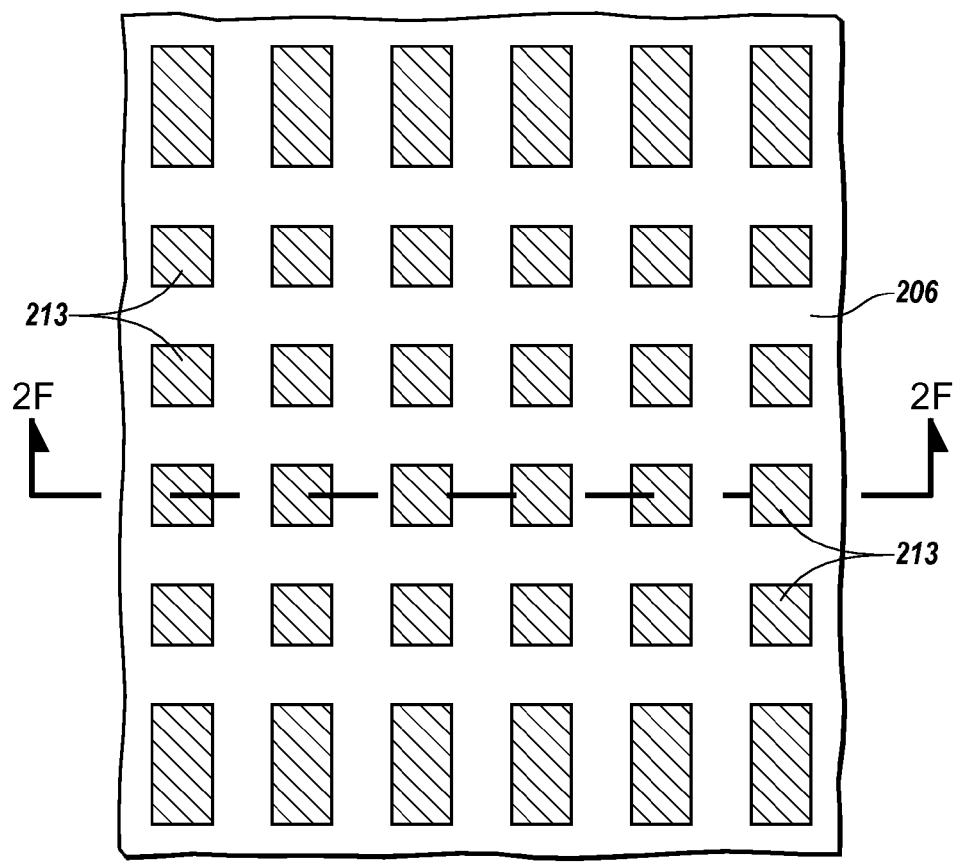
Figure 2F:
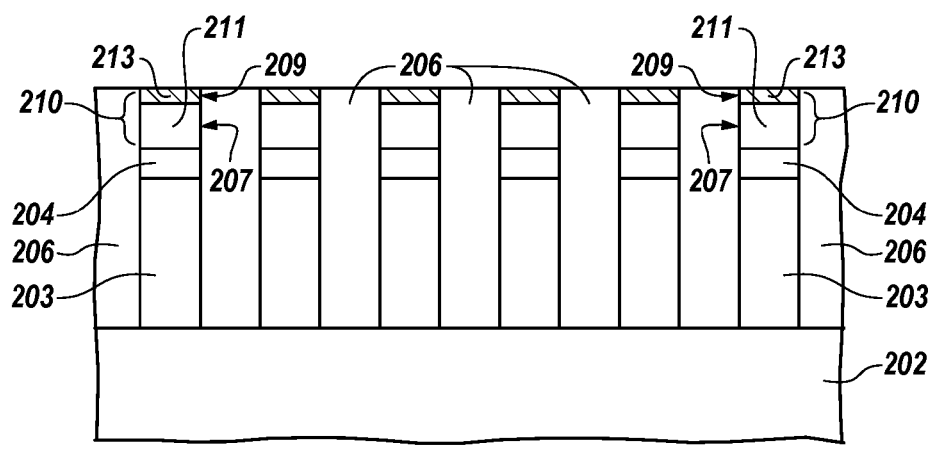

FIGS. 2E and 2F illustrate the number of resistance variable memory cells at a subsequent processing stage. One or more embodiments include modifying at least a portion of the silicide material 211. For instance, FIGS. 2E and 2F illustrate a modified region 209 of the metal silicide 211. Modifying the silicide 211 can include modifying a resistivity of at least a portion of the silicide 211. As an example, the resistivity of the modified region 209 can be higher than the resistivity of the unmodified region 207. That is, the resistivity of material 213 can be increased as compared to the resistivity of silicide 211. In various embodiments, the modified region 209 includes a silicide material 213. For instance, modifying the silicide 211 can include forming a modified silicide material 213 (e.g., a silicide material 213 having a higher resistivity than the silicide material 211). Embodiments are not limited to this example. For instance, in some embodiments, the resistivity of the modified region 209 can be lower than the resistivity of the unmodified region 207.

The modification of the silicide material 211 provides a conductive contact 210 comprising the modified region 209 (e.g., silicide material 213) and an unmodified region 207 (e.g., silicide material 211). In one or more embodiments, the modified region 209 and the unmodified region 207 form a silicide gradient between an upper surface of the contact 210 and a lower surface of the conductive contact 210. The upper surface of contact 210 can interface with a heater element (e.g., heater 115 shown in FIG. 1) and the lower surface of contact 210 can interface with the select device (e.g., with the material 204). As described further below, providing different silicide materials at the interfaces between the contact 210 and the select device and between the contact 210 and a heater element can provide various benefits such as improving the current driving capability of the select device, among other benefits.

In one or more embodiments, modifying the silicide material 211 includes performing an etch process on the silicide 211 in order to form the modified region 209. As an example, a fluorine (F) plasma treatment using a plasma such as $SF_6$ (sulfur hexafluoride) or $NF_3$ (nitrogen trifluoride), for instance, can be performed on the silicide material 211 in order to form the modified region 209. An F-plasma treatment can remove silicon from a surface of the silicide 211, which can lower the resistivity of the region 209. In one or more embodiments, the silicide material 211 can be cobalt disilicide ($CoSi_2$). Performing an F-plasma treatment on the silicide 211 can remove silicon from the $CoSi_2$ such that the modified region 209 includes a cobalt monosilicide (CoSi) material 213. Embodiments are not limited to particular silicide material 211 or to a particular modified silicide material 213. In one or more embodiments, the silicide 211 can be a material such as titanium silicide ($TiSi_2$) or nickel silicide (NiSi), which can be treated such that the modified region 209 includes a different material 213.

Figure 2G:
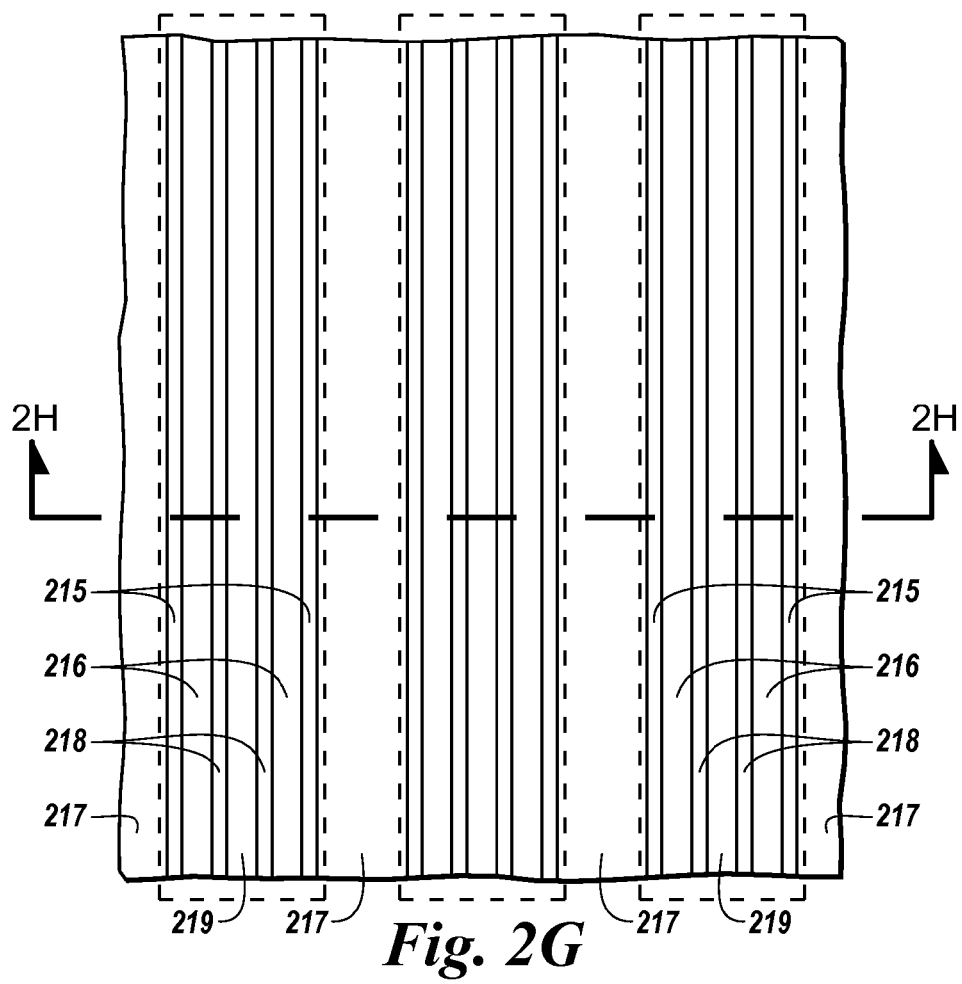
Figure 2H:
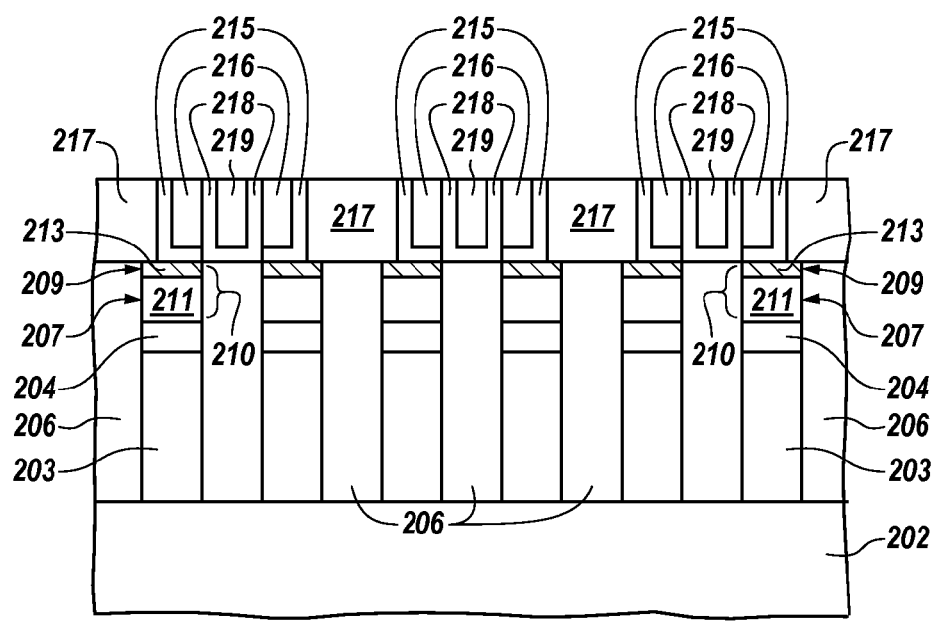

FIGS. 2G and 2H illustrate the number of resistance variable memory cells at a subsequent processing stage. The example illustrated in FIGS. 2G and 2H includes conductive elements 215 (e.g., heater elements) formed on a portion of a surface of the modified silicide region 209 of contact 210. The conductive elements 215 can be formed, for instance, by a masking and etching process. As one example, a dielectric material 217 can be formed on the substrate structure illustrated in FIG. 2F. The dielectric 217 can include a material such as silicon nitride or silicon dioxide, among various other dielectric materials. Portions of the material 217 can be removed (e.g., via etching) and the heater material 215 can be formed (e.g., conformally deposited) on the substrate surface. The dashed lines in FIG. 2G represent openings formed in the dielectric material 217 prior to deposition of the heater material 215. A dielectric material 216 can be formed on the heater material 216 and then portions of the heater material 215 and dielectric material 216 can be removed to form the separate heater elements 215. Unfilled regions between the separated heater elements 215 can then be filled with one or more dielectric materials (e.g., dielectric materials 218 and 219 in this example) and the substrate surface can be planarized (e.g., via a CMP process), resulting in the structure shown in FIG. 2H. In this example, the dielectric materials formed in the unfilled portions of the openings in material 217 include dielectric materials 216, 218, and 219. However, embodiments are not limited to particular dielectric materials. Additionally, embodiments of the present disclosure are not limited to the particular method of forming heater elements 215 as illustrated in FIGS. 2G and 2H. In one or more embodiments, the interface resistance between the heater 215 and the modified region 209 is lower than the interface resistance between the heater 215 and the unmodified region 207.

Figure 2I:
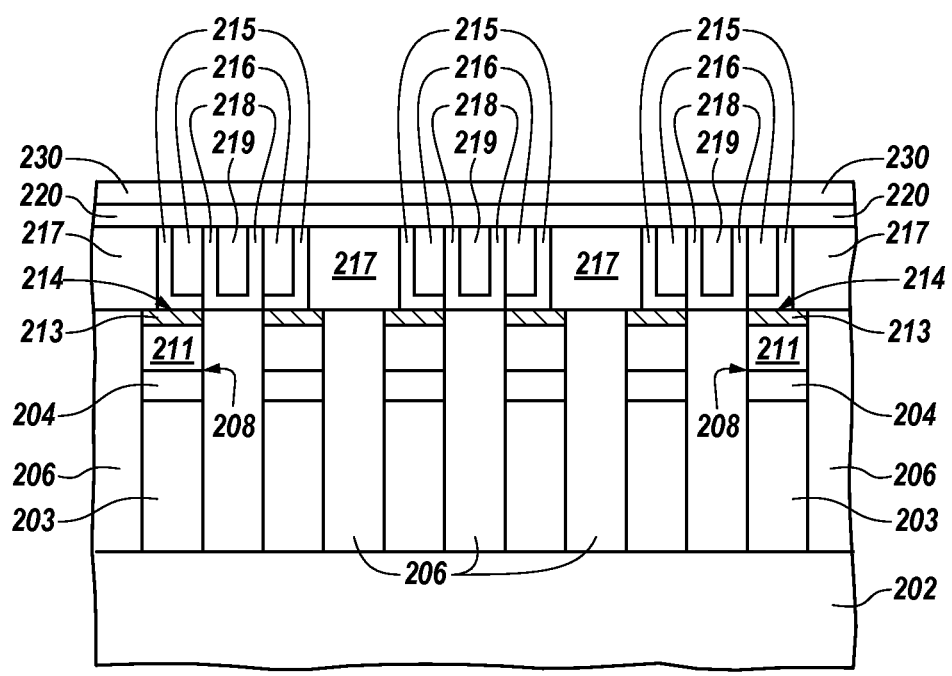

FIG. 2I illustrates the number of resistance variable memory cells at a subsequent processing stage. The example illustrated in FIG. 2I includes a resistance variable material 220 formed on the substrate structure illustrated in FIG. 2H and a conductive material 230 formed on the resistance variable material 220. As mentioned above, the resistance variable material 220 can be a phase change material or other suitable resistance variable material. In one or more embodiments, the conductive material 230 can be a conductive contact that may be coupled to a bit line associated with the memory cells. As an example, the material 230 can include an electrode material such as copper, platinum, tungsten, and/or silver, among various other conductive materials and/or combinations thereof. In one or more embodiments, the material 230 may be referred to as a top electrode material. Although not illustrated in FIG. 2I, one of ordinary skill in the art will appreciate that portions of the materials 220 and/or 230 can be removed to form a number of separate resistance variable memory cell structures.

As illustrated in FIG. 2I, at least a portion of the surface 214 of the material 213 is in contact with a surface of the heater 215. Also, at least a portion of the surface 208 of the material 213 is in contact with the select device (e.g., with the material 204 of the select device). As such, the interface between the conductive contact 210 and the select device is a different silicide material (e.g., 211) than the interface between the conductive contact 210 and the heater element 215 (e.g., modified silicide material 213). The differing interface properties associated with the silicide materials 211 and 213 can increase the current driving capability associated with the select device as compared to a conductive contact 210 that includes only one particular silicide material, such that the same silicide material comprises the select device/contact interface and the heater/contact interface.

Figure 3A:
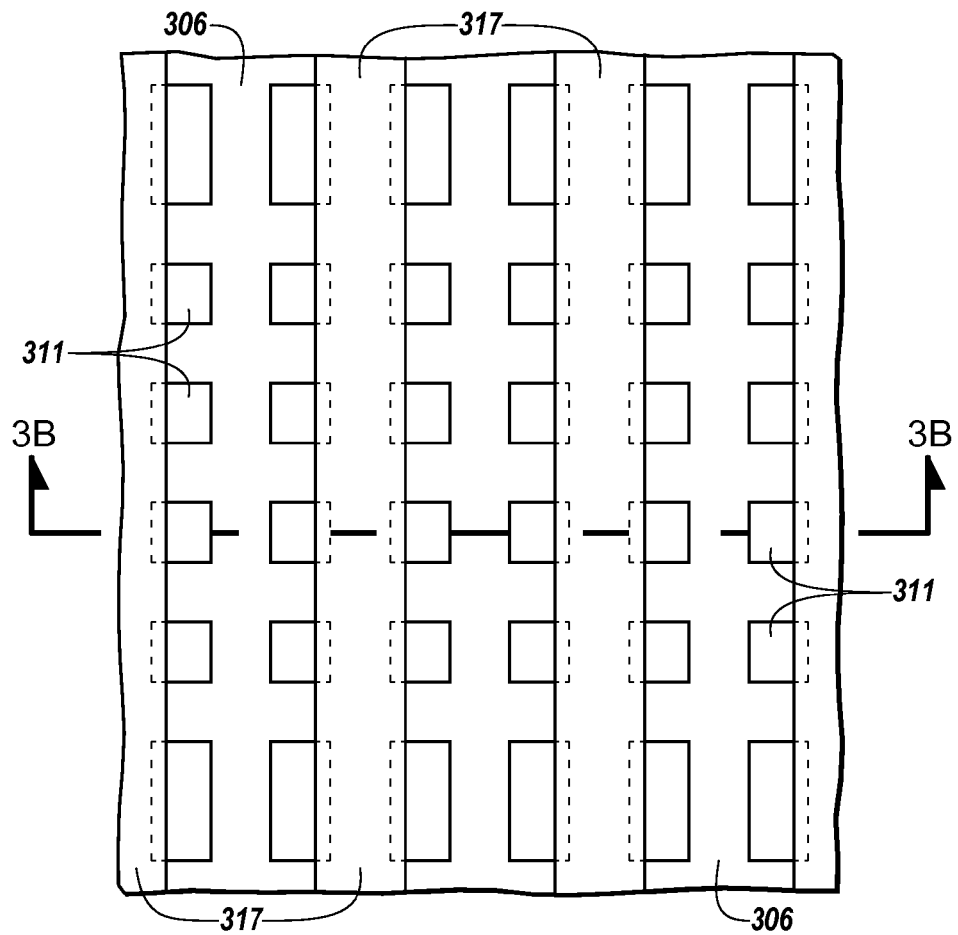
FIGS. 3A-3E illustrate an example of processing steps associated with forming a number of resistance variable memory cells in accordance with one or more embodiments of the present disclosure.
Figure 3B:
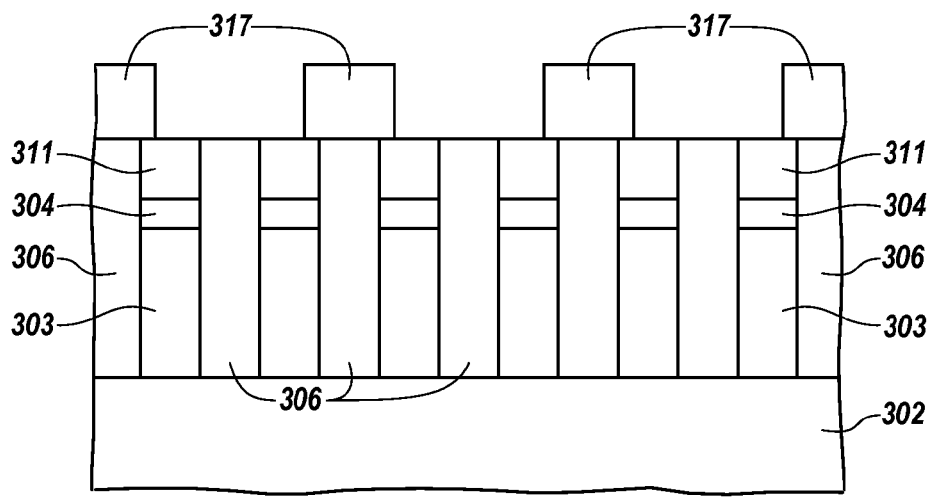

FIGS. 3A-3E illustrate an example of processing steps associated with forming a number of resistance variable memory cells in accordance with one or more embodiments of the present disclosure. FIGS. 3A and 3B illustrate the substrate structure of FIGS. 2D and 2E subsequent to a processing step in which a dielectric material 317 is formed thereon and used as a mask to form a number of heater elements 315 as described further below.

Similar to the example described in connection with FIGS. 2A-2I, the embodiment of FIGS. 3A through 3E include a number of select devices formed on a base semiconductor substrate 302. As an example, the select devices can be bipolar junction transistors (BJTs). For instance, the select devices can be pnp BJTs in which the material 302 is a p-type semiconductor serving as a collector, the material 303 is an n-type semiconductor serving as a base, and the material 304 is a p+ semiconductor material serving as an emitter. The select devices illustrated in FIGS. 3A-3E can be formed via known semiconductor processing techniques, and the material 306 can be a dielectric material such as silicon dioxide ($SiO_2$), among other suitable dielectric materials. Also, as similarly described above in connection with FIGS. 2C and 2D, a silicidation process can be performed to create a metal silicide material 311 on the semiconductor material 304 (e.g., the emitter) of the BJT.

In FIGS. 3A and 3B, portions of dielectric material 317 are removed such that at least a portion of the remaining dielectric material 317 overlaps an upper surface of the silicide material 311. In this example, the dielectric material 317 is formed on the substrate structure and the portions thereof are subsequently removed prior to forming a modified region of the silicide 311.

Figure 3C:
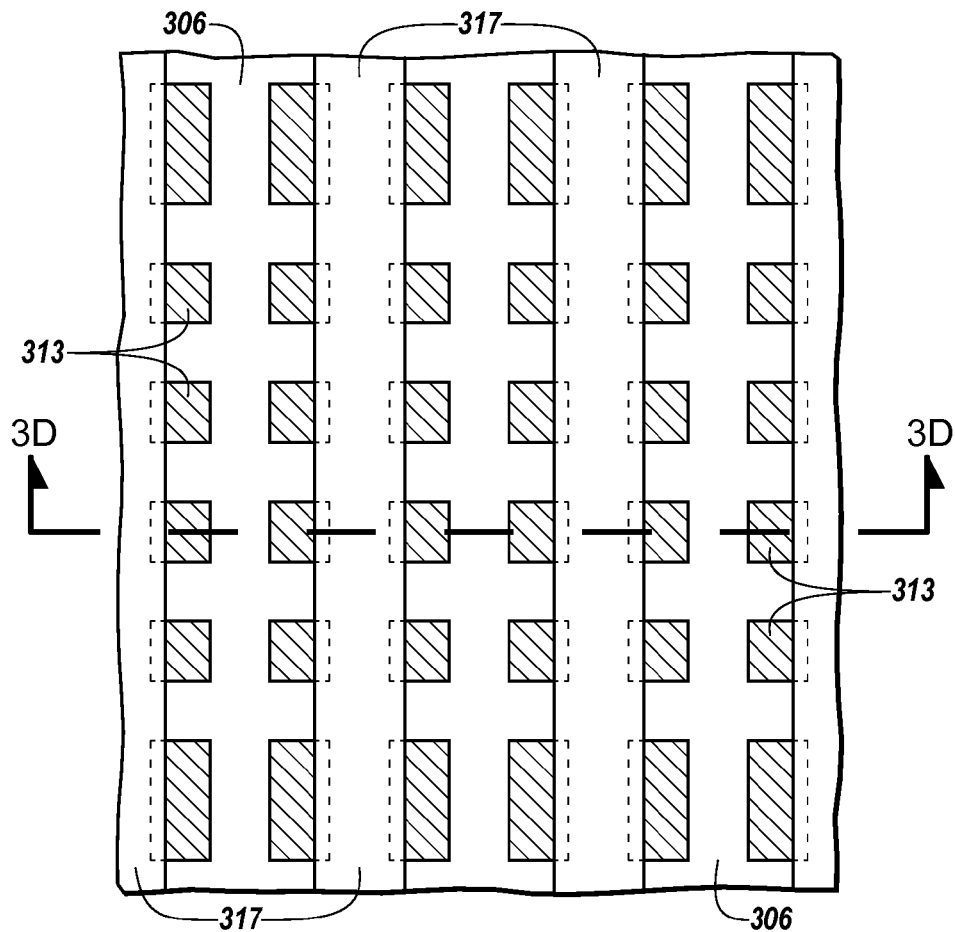
Figure 3D:
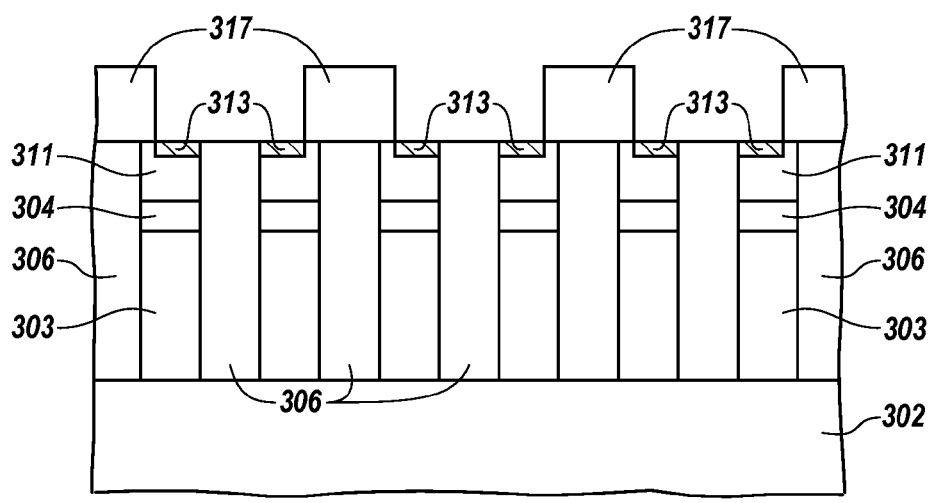

FIGS. 3C and 3D illustrate the number of resistance variable memory cells at a subsequent processing stage. In the example shown in FIGS. 3C and 3D, a portion of the silicide material 311 has been modified and a modified portion 313 has been created. The modified portion can be a silicide material 313 having a different stoichiometry as compared to a resistivity of the silicide material 311. The modification of the silicide material 311 provides a conductive contact comprising the modified region (e.g., silicide material 213) and an unmodified region (e.g., silicide material 211). In one or more embodiments, the modified region and the unmodified region form a silicide gradient between an upper surface and a lower surface of the conductive contact. The modified silicide region and unmodified silicide region can provide a silicide interface between a select device of a memory cell and a heater element of the memory cell. In various embodiments, the silicide material 313 of the modified region (e.g., the portion of the silicide interface in contact with the heater element) has a modified stoichiometry as compared to the silicide material 311 of the unmodified region (e.g., the portion of the silicide interface in contact with the select device.

The modified silicide material 313 can be formed, for example, via an etch process (e.g., a dry etch using an F-plasma). An F-plasma treatment can remove silicon from a surface of the silicide 311, which can alter the stoichiometry of the silicide material 311, and thereby form the modified silicide material 313. As an example, the silicide material 313 can have a higher resistivity as compared to the resistivity of the silicide material 311. As noted above, in one or more embodiments, the silicide material 311 can be cobalt disilicide ($CoSi_2$) and the modified silicide material 313 can be cobalt monosilicide (CoSi), for instance. Embodiments are not limited to particular silicide material 311 or to a particular modified silicide material 313. For instance, in one or more embodiments, the silicide material 313 can have a lower resistivity as compared to the resistivity of the silicide material 311.

Figure 3E:
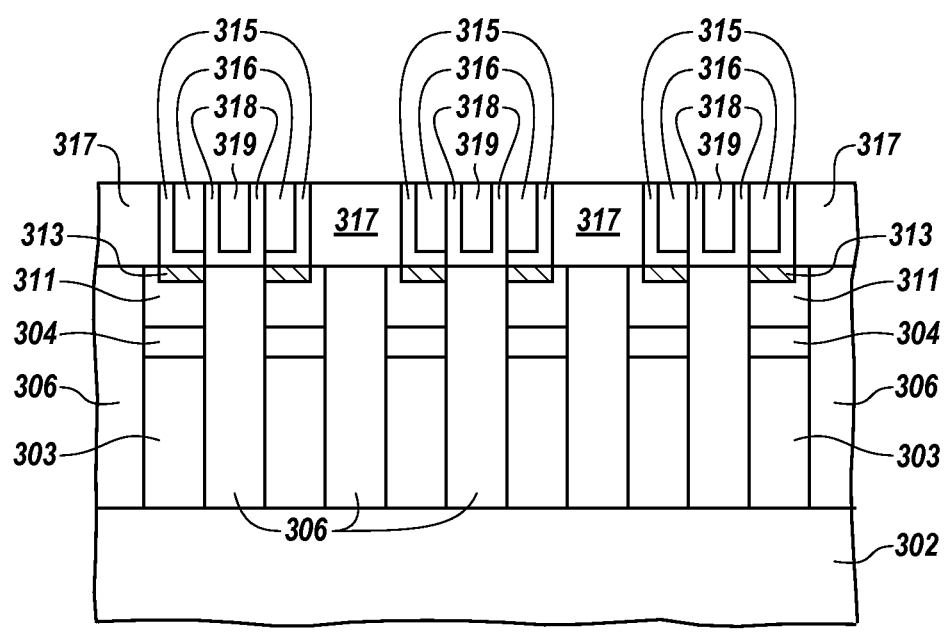

FIG. 3E illustrates the number of resistance variable memory cells at a subsequent processing stage. The example illustrated in FIG. 3E includes conductive elements 315 (e.g., heater elements) formed on a portion of a surface of the silicide interface comprised of silicide material 311 and modified silicide material 313. In this example, portions of the dielectric material 317 overlap the surface of the silicide material 311 such that the modified silicide material 313 is self-aligned with the heater 315. The conductive elements 315 can be formed, for instance, by a masking and etching process such as that described above in connection with FIGS. 2G and 2H. As such, the embodiment illustrated in FIG. 3E includes dielectric materials 316, 318, and 319 formed between adjacent heater elements 315. The dielectric materials can include various dielectric materials such as silicon dioxide and/or silicon nitride, among other suitable materials. Embodiments of the present disclosure are not limited to particular dielectric materials or to a particular method of forming heater elements 315.

As described above in connection with FIG. 2I, a resistance variable material, such as a phase change material, can be formed on the substrate structure of FIG. 3E. Also, a conductive material such as a top electrode material can be formed on the resistance variable material.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A resistance variable memory cell, comprising:
a silicide material formed on a select device and serving as an interface between a heater element of the memory cell and the select device;
wherein the silicide material includes:
an unmodified region having a surface that interfaces with the select device; and
a modified region having a surface that interfaces with the heater element, the modified region having a resistivity that is different than a resistivity of the unmodified region; and
a resistance variable material formed on the heater element.

2. The memory cell of claim 1, wherein the modified region includes a silicide having a depletion of silicon as compared to the unmodified region.

3. The memory cell of claim 1, wherein the resistivity of the modified region is higher than the resistivity of the unmodified region.

4. The memory cell of claim 1, wherein the modified region and the unmodified region form a silicide gradient between the surface that interfaces with the select device and the surface that interfaces with the heater.

5. The memory cell of claim 1, including a dielectric material formed on a portion of the modified region.

6. The memory cell of claim 1, wherein the select device is a bipolar select device, and wherein the surface of the unmodified region that interfaces with the bipolar select device interfaces with an emitter of the bipolar select device.

7. The memory cell of claim 1, wherein the unmodified region includes cobalt disilicide ($CoSi_2$) and the modified region includes cobalt monosilicide (CoSi).

8. The memory cell of claim 1, wherein the heater element includes at least one of:
   titanium nitride;
   titanium silicon nitride;
   titanium aluminum nitride; and
   tantalum nitride.

9. The memory cell of claim 1, wherein the silicide material includes at least one of:
   cobalt silicide;
   titanium silicide; and
   nickel silicide.

10. A resistance variable memory cell, comprising:
   a silicide material between a select device and a heater element;
   wherein the silicide material includes a silicide gradient having at least a portion of a first surface interfacing with the select device and at least a portion of a second surface interfacing with the heater element; and
   wherein the silicide gradient includes a modified region of the silicide material, the modified region including the second surface and having a higher resistivity than a resistivity of an unmodified region of the silicide material; and
   a resistance variable material formed on the heater element.

11. The memory cell of claim 10, wherein the at least a portion of the second surface interfacing with the heater element is the only portion of the second surface that interfaces with the heater element.

12. The memory cell of claim 11, wherein the modified region of the silicide material includes cobalt disilicide and the unmodified region of the silicide material includes cobalt monosilicide.

13. The memory cell of claim 10, wherein an interface resistance between the heater element and the modified region is lower than an interface resistance between the heater element and the unmodified region.

* * * * *